(12) United States Patent
Pierrat et al.

(10) Patent No.: US 6,560,766 B2
(45) Date of Patent: May 6, 2003

(54) METHOD AND APPARATUS FOR ANALYZING A LAYOUT USING AN INSTANCE-BASED REPRESENTATION

(75) Inventors: Christophe Pierrat, Santa Clara, CA (US); Chin-hsen Lin, Fremont, CA (US); Yao-Ting Wang, Sunnyvale, CA (US); Fang-Cheng Chang, Sunnyvale, CA (US)

(73) Assignee: Numerical Technologies, Inc., San Jose, CA (US)

( * ) Notice: Subject to any disclaimer, the term of this patent is extended or adjusted under 35 U.S.C. 154(b) by 0 days.

(21) Appl. No.: 09/917,526

(22) Filed: Jul. 26, 2001

(65) Prior Publication Data

US 2003/0023939 A1 Jan. 30, 2003

(51) Int. Cl.7 .................................................. G06F 17/50
(52) U.S. Cl. ........................ 716/19; 716/17; 716/21; 716/8; 716/11; 716/4; 716/5
(58) Field of Search ............................ 716/19, 17, 21, 716/8, 11, 4, 5

(56) References Cited

U.S. PATENT DOCUMENTS

| | | | | |
|---|---|---|---|---|
| 5,182,718 A | 1/1993 | Harafuji et al. | ............. | 364/490 |
| 5,326,659 A | 7/1994 | Liu et al. | ........................ | 430/5 |
| 5,340,700 A | 8/1994 | Chen et al. | ................. | 430/312 |
| 5,432,714 A | 7/1995 | Chung et al. | ................ | 364/525 |
| 5,533,148 A | 7/1996 | Sayah et al. | ................. | 382/240 |
| 5,538,815 A | 7/1996 | Oi et al. | ......................... | 430/5 |

(List continued on next page.)

FOREIGN PATENT DOCUMENTS

| | | |
|---|---|---|
| JP | 3-80515 | 4/1991 |
| WO | WO 97/13370 | 4/1997 |
| WO | WO 97/38381 | 10/1997 |
| WO | WO 98/20327 | 5/1998 |
| WO | WO 98/45685 | 10/1998 |
| WO | WO 99/14636 A1 | 3/1999 |
| WO | WO 99/14637 A1 | 3/1999 |
| WO | WO 99/14638 A1 | 3/1999 |
| WO | WO 99/14706 A2 A3 | 3/1999 |
| WO | WO 99/38002 | 7/1999 |
| WO | WO 99/56113 | 11/1999 |
| WO | WO 99/59200 | 11/1999 |

(List continued on next page.)

OTHER PUBLICATIONS

Cobb, et al., "Fast Sparse Aerial Image Calculation for OPC", SPIE, vol. 2621, pp. 534–544 No date.
Adam, K., et al., "Simplified Models for Edge Transitions in Rigorous Mask Modeling", University of California Berkeley (40 pages) No date.
Gordon, R., et al., "Mask Topography Simulation for EUV Lithography", FINLE Technologies Inc. (15 pages) No date.
Pistor, T., "Rigorous 3D Simulation of Phase Defects in Alternating Phase–Shifting Masks", Panoramic Technology Inc. (13 pages) No date.

(List continued on next page.)

Primary Examiner—Vuthe Siek
Assistant Examiner—Magid Y Dimyan
(74) Attorney, Agent, or Firm—Park, Vaughan & Fleming LLP (57) ABSTRACT

One embodiment of the invention provides a system that analyzes a layout related to a circuit on a semiconductor chip using an instance-based representation of a set of geometrical features that comprise the layout. The system operates by receiving a representation of the layout, wherein the representation defines a plurality of nodes that include one or more geometrical features. Next, the system converts the representation into an instance-based representation by identifying multiple occurrences of identical node instances in the layout, wherein each node instance can be further processed without having to consider effects of external factors on the node instance. The system then performs an further processing on the instance-based representation by processing each node instance only once, whereby the processing does not have to be repeated on multiple occurrences of the node instance in the layout.

39 Claims, 9 Drawing Sheets

U.S. PATENT DOCUMENTS

| | | |
|---|---|---|
| 5,572,598 A | 11/1996 | Wihl et al. .................. 382/144 |
| 5,631,110 A | 5/1997 | Shioiri et al. .................. 430/5 |
| 5,657,235 A | 8/1997 | Liebmann et al. ..... 364/474.24 |
| 5,682,323 A | 10/1997 | Pasch et al. ................ 364/491 |
| 5,795,688 A | 8/1998 | Burdorf et al. ............... 430/30 |
| 5,801,954 A | 9/1998 | Le et al. ..................... 364/488 |
| 5,804,340 A | 9/1998 | Garza et al. ................... 430/5 |
| 5,815,685 A | 9/1998 | Kamon ....................... 395/500 |
| 5,825,647 A | 10/1998 | Tsudaka ................ 364/167.03 |
| 5,847,959 A | 12/1998 | Veneklasen et al. ... 364/468.28 |
| 5,849,440 A | 12/1998 | Lucas et al. ................... 430/5 |
| 5,862,058 A | 1/1999 | Samuels et al. ............ 364/491 |
| 5,885,734 A | 3/1999 | Pierrat et al. .................. 430/5 |
| 5,900,338 A | 5/1999 | Garza et al. ................... 430/5 |
| 5,923,566 A | 7/1999 | Galan et al. ................ 364/489 |
| 6,009,250 A | 12/1999 | Ho et al. ............... 395/500.06 |
| 6,009,251 A | 12/1999 | Ho et al. ............... 395/500.06 |
| 6,011,911 A | 1/2000 | Ho et al. ............... 395/500.06 |
| 6,016,357 A | 1/2000 | Neary et al. ................ 382/144 |
| 6,023,328 A | 2/2000 | Pierrat ..................... 356/237.4 |
| 6,064,806 A | 5/2000 | Lakos et al. ........... 395/500.04 |
| 6,076,465 A | 6/2000 | Vacca et al. ................ 101/481 |
| 6,077,310 A | 6/2000 | Yamamoto et al. ........... 716/19 |
| 6,078,738 A | 6/2000 | Garza et al. ........... 395/500.22 |
| 6,081,658 A | 6/2000 | Rieger et al. .......... 395/500.22 |
| 6,081,659 A | 6/2000 | Garza et al. ........... 395/500.22 |
| 6,091,845 A | 7/2000 | Pierrat et al. ............... 382/144 |
| 6,130,750 A | 10/2000 | Ausschnitt et al. ......... 356/401 |
| 6,171,731 B1 | 1/2001 | Medvedeva et al. ........... 430/5 |
| 6,272,236 B1 | 8/2001 | Pierrat et al. ............... 382/144 |
| 6,334,209 B1 | 12/2001 | Hashimoto et al. ........... 716/21 |
| 6,339,836 B1 | 1/2002 | Eisenhofer et al. ............ 716/5 |
| 6,346,426 B1 | 2/2002 | Toprac et al. .................. 438/8 |
| 6,370,677 B1 * | 4/2002 | Carruthers et al. ............ 716/8 |
| 6,370,679 B1 | 4/2002 | Chang et al. ................. 716/19 |
| 6,449,749 B1 * | 9/2002 | Stine ............................. 716/4 |
| 6,453,452 B1 | 9/2002 | Chang et al. ................... 716/8 |
| 6,470,489 B1 * | 10/2002 | Chang et al. ................. 716/21 |
| 2002/0010904 A1 | 1/2002 | Ayres .......................... 716/19 |
| 2002/0019729 A1 | 2/2002 | Chang et al. .................. 703/6 |
| 2002/0152449 A1 * | 10/2002 | Lin ............................. 716/17 |
| 2002/0152454 A1 | 10/2002 | Cote, et al. .................... 716/21 |

FOREIGN PATENT DOCUMENTS

| | | |
|---|---|---|
| WO | WO 99/67626 | 12/1999 |
| WO | WO 00/36525 A3 | 6/2000 |
| WO | WO 00/67074 A1 | 11/2000 |
| WO | WO 00/67075 A1 | 11/2000 |
| WO | WO 00/67076 A1 | 11/2000 |
| WO | WO 02/29491 A1 | 4/2002 |

OTHER PUBLICATIONS

Semmier, A., et al., "Application of 3D EMF Simulation for Development and Optimization of Alternating Phase Shifting Masks", Infineon Technologies AG (12 pages) No date.

Wong, A., et al., "Polarization Effects in Mask Transmission", University of California Berkeley (8 pages) No date.

Neureuther, A., et al., "Modeling Defect–Feature Interactions in the Presence of Aberrations", University of California Berkeley (10 pages) No date.

Mathur, B.P., et al., "Quantitative Evaluation of Shape of Image on Photoresist of Square Apertures", IEEE, Transactions On Electron Devices, vol. 35, No. 3, pp. 294–297, Mar. 1988.

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Crisalle, O., et al., "A Comparison of the Optical Projection Lithography Simulators in Sample and Prolith", IEEE, Transactions On Semiconductor Manufacturing, vol. 5, No. 1, pp. 14–26, Feb. 1992.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Qian, G.D., et al., "A New Scalar Planewave Model for High NA Lithography Simulations", IEEE, pp. 45–48 (1994).

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Balasinski, A., et al., "A Novel Approach to Simulate the Effect of Optical Proximity on Mosfet Parametric Yield", IEEE, pp. 37.6.1–37.6.4 (1999).

Balasinski, A., et al., "Comparison of Mask Writing Tools and Mask Simulations for 0.16um Devices", IEEE, SEMI Advanced Semiconductor Manufacturing Conference, pp. 372–377 (1999).

Lithas, "Lithas: Optical Proximity Correction Software" (2 pages) No date.

Spence, C., et al., "Detection of 60(degree) Phase Defects on Alternating PSMs", Advanced Micro Devices KLA–Tencor, DuPont RTC (2 pages) No date.

Ogawa, K., et al., "Phase Defect Inspection by Differential Interference", Lasertec Corporation (12 pages) No date.

Socha, R., et al., "Printability of Phase–Shift Defects Using a Perturbational Model", Univ. of California Berkeley, Sematech (11 pages) No date.

Fiekowsky, P., "The End of Thresholds: Subwavelength Optical Linewidth Measurement Using the Flux–Area Technique", Automated Visual Inspection (6 pages) No date.

Watanabe, H., et al., "Detection and Printability of Shifter Defects in Phase–Shifting Masks", Japanese Journal of Applied Physics, vol. 30, No. 11B, pp. 3016–3020, Nov. 1991.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Reynolds, J., "Elusive Mask Defects: Reflectivity Variations", Solid State Technology, pp. 75–76, Mar. 1995.

Kusunose, H., et al., "Direct Phase–Shift Measurement with Transmitted Deep–UV Illumination",SPIE, vol. 2793, pp. 251–260 (1996).

Tsujimoto, E., et al., "Hierarchical Mask Data Design System (Prophet) for Aerial Image Simulation, Automatic Phase– Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Fiekowsky, P., et al., "Defect Printability Measurement on the KLA–351: Correlation to Defect Sizing Using the AVI Metrology System", SPIE 19th Annual BACUS Symposium on Photomask Technology and Management Conference, pp. 1–6, Sep. 1999.

Tejnil, F., et al., "Option for At–Wavelength Inspection of Patterned Extreme Ultraviolet Lithography Masks", SPIE Bacus '99, pp. 1–12 (1999).

Hemar, S., et al., "Finding Killer CD Variations by Full– Reticle CD Mapping", Microlithography World, pp. 4, 6, 8 & 10 (Summer 2000).

Brunner, T. et al., "Approximate Models For Resist Processing Effects", *SPIE*, vol. 2726, pp. 198–207, Mar. 1996.

Casey, Jr., J.D. et al., "Chemically Enhanced FIB Repair Of Opaque Defects On Molybdenum Silicide Photomasks", *SPIE*, vol. 3236, pp. 487–497 (1997).

Chang, K. et al., "Accurate Modeling of Deep Submicron Interconnect Technology", *TMA Times*, vol. IX, No. 3 (1997).

Fukuda, H. et al., "Determination Of High–Order Lens Aberration Using Phase/Amplitude Linear Algebra", *J. Vac. Sci. Technol. B*, vol. 17, No. 6, pp. 3318–3321, Nov./Dec. 1999.

Fukuda, H., "Node–Connection/Quantum Phase–Shifting Mask: Path To Below 0.3 μm Pitch, Proximity Effect Free, Random Interconnects And Memory Patterning", *J. Vac. Sci. Technol. B*, vol. 17, No. 6, pp. 3291–3295, Nov./Dec. 1999.

Gans, F. et al., "Printability And Repair Techniques For DUV Photomasks", *SPIE*, Proceedings of the 17th Annual Symposium on Photomask Technology and Management, Vol. 3236, pp. 136–141 (1997).

Ham, Y.M. et al., "Dependence Of Defects In Optical Lithography", *Jpn. J. Appl. Phys.*, vol. 31, pp. 4137–4142 (1992).

Harafuji, K. et al., "A Novel Hierarchical Approach For Proximity Effect Correction In Electron Beam Lithography", *IEEE*, vol. 12, No. 10, pp. 1508–1514, Oct. 1993.

Henke, W. et al., "A Study Of Reticle Defects Imaged Into Three–Dimensional Developed Profiles Of Positive Photoresist Using The Solid Lithography Simulator", *Microelectronics Eng.*, vol. 14, pp. 283–297 (1991).

Ibsen, K. et al., "Clear Field Reticle Defect Disposition For Advanced Sub–Half Micron Lithography", *SPIE*, Proceedings of the 17th Annual Symposium on Photomask Technology and Management, vol. 3236, pp. 124–135 (1997).

Karklin, L., "A Comprehensive Simulation Study Of The Photomask Defects Printability", *SPIE*, vol. 2621, pp. 490–504 (1995).

Kubota, H. et al., "A Fast Method Of Simulating Resist Pattern Contours Based On Mean Inhibitor Concentration", *Jpn. J. Appl. Phys.*, vol. 37, pp. 5815–5820 (1998).

Neureuther, A., "Modeling Phase Shifting Masks", *SPIE*, 10th Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, vol. 2254, pp. 78–92 (1994).

Nistler, J. et al., "Phase Shift Mask Defect Printability Analysis", Proceedings of the Microlithography Seminar Interface '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 31, pp. 4143–4149 (1992).

Pati, Y.C. et al., "Exploiting Structure In Fast Aerial Image Computation For Integrated Circuit Patterns", *IEEE* Transactions on Semiconductor Manufacturing, vol. 10, No. 1, pp. 62–74, Feb. 1997.

Pati, Y.C. et al., "Phase–Shifting Masks For Microlithography: Automated Design And Mask Requirements", *J. Opt. Soc. Am.*, vol. 11, No. 9, pp. 2438–2452, Sep. 1994.

Rieger, M. et al., "System For Lithography Proximity Compensation", Precim Company, Portland, Oregon, Sep. 1993 (28 pages).

Rieger, M. et al., "Using Behavior Modeling For Proximity Correction", Precim Company, Portland, Oregon (6 pages) No date.

Spence, C. et al., "Automated Determination Of CAD Layout Failures Through Focus: Experiment And Simulation", *SPIE*, vol. 2197, pp. 302–313 (1994).

Stirniman, J. et al., "Spatial Filter Models To Describe IC Lithographic Behavior", Precim Corporation, Portland, Oregon (10 pages) No date.

Stirniman, J. et al., "Wafer Proximity Correction And Its Impact On Mask–Making", *Bacus News*, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages) No date.

Vacca, A. et al., "100nm Defect Detection Using A Dynamically Programmable Image Processing Algorithm", *SPIE*, vol. 3236 (1997) (Abstract Only).

Vacca, A. et al., "100nm Defect Detection Using An Existing Image Acquisition System", *SPIE*, vol. 3236, pp. 208–214 (1998).

Watanabe, H. et al., "Detection And Printability Of Shifter Defects In Phase–Shifting Masks II Defocus Characteristics", *Jpn. J. Appl. Phys.*, vol. 31, pp. 4155–4160 (1992).

Wiley, J. et al., "Device Yield And Reliability By Specification Of Mask Defects", *Solid State Technology*, vol. 36, No. 7, pp. 65–66, 70, 72, 74, 77, Jul. 1993.

Wiley, J. et al., "The Effect Of Off–Axis Illumination On The Printability Of Opaque And Transparent Reticle Defects", *SPIE*, vol. 2512, pp. 432–440 (1995).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

Lin, B. J., et al., "Single–Level Electric Testsites for Phase– Shifting Masks", SPIE, Vol. 1673, pp.221–228, Mar. 9–11, 1992.

* cited by examiner

```
T
{
    REF LIST AT_A, BT_B
}

A
{

REF LIST CT_CA
}

**FIG. 9B
PROXIMITY EFFECT
(PRIOR ART)**

METHOD AND APPARATUS FOR ANALYZING A LAYOUT USING AN INSTANCE-BASED REPRESENTATION

RELATED APPLICATIONS

The subject matter of this application is related to the subject matter in a co-pending non-provisional application by inventor Chin-hsen Lin, filed on Apr. 13, 2001, entitled, "Generating An Instance-Based Representation of a Design Hierarchy," having Ser. No. 09/835,313.

BACKGROUND

1. Field of the Invention

The invention relates to the process of designing an integrated circuit. More specifically, the invention relates to a method and an apparatus for using an instance-based representation of a set of geometrical features that comprise a layout of a circuit on a semiconductor chip in order to speed up subsequent operations on the layout.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

Figure 1A:
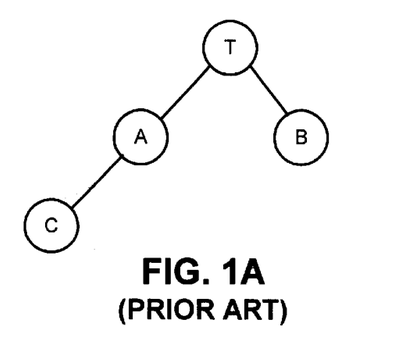
FIG. 1A illustrates a hierarchical representation of a layout in nodal form.
Figure 1B:
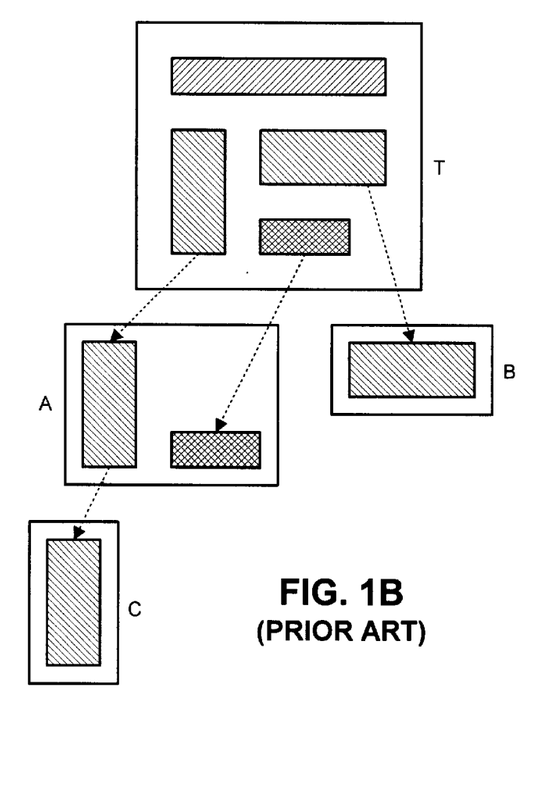
FIG. 1B illustrates a hierarchical representation of the layout in graphical form.
Figure 1C:
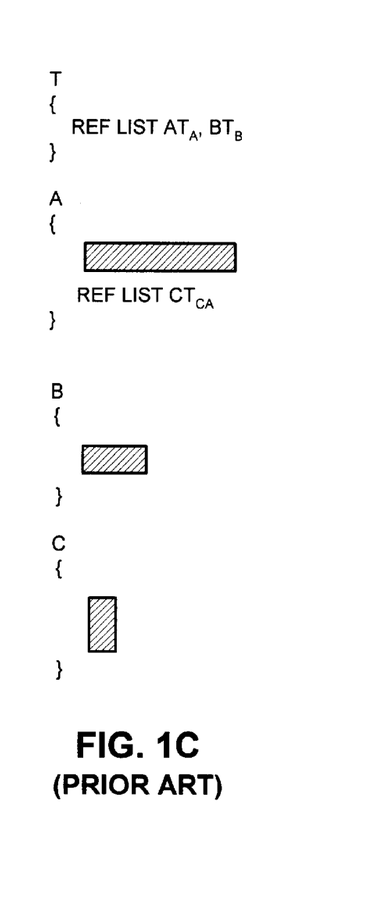
FIG. 1C illustrates a hierarchical representation of the layout in code form.

A layout for a semiconductor chip is often stored in a standard hierarchical format, such as GDSII stream format. For example, FIGS. 1A, 1B and 1C illustrate how a layout, T, can be composed of a sub-cell A and a sub-cell B, wherein the sub-cell A further includes a sub-cell C. FIG. 1A illustrates a nodal representation of this hierarchy, while FIG. 1B illustrates a corresponding graphical representation.

FIG. 1C presents a specification of the layout in code form. In this form, the layout, T, includes a reference list. This reference list includes a reference to cell A along with an associated transformation, $T_A$, and a reference to cell B along with an associated transformation, $T_B$. Similarly, the layout for cell A includes geometrical features associated with cell A along with a reference cell C. This reference to cell C is accompanied by a transformation of cell C with respect to A, $T_{CA}$. The layouts for cell B and cell C include geometrical features associated with cell B and cell C, respectively.

Representing a layout in a hierarchical format can cause problems for various operations related to production of a semiconductor chip, such as die-to-database inspection of a mask, defect analysis on a wafer or a mask, verification of a layout against a simulated silicon image of the layout, and proximity effect correction during mask writing.

During any of these operations, interactions between nodes within the hierarchical representation can cause erroneous results. This problem can be remedied by collapsing the hierarchy down into a single monolithic layout before performing the operations. Unfortunately, this technique can be prohibitively slow because the operations must be applied to the entire monolithic layout, even though many of the cells in the layout many be repeated.

What is needed is a method and an apparatus for performing a computational operation on a hierarchical representation of a layout without performing the computational operation over the entire layout, and without the above-described problems associated with using a hierarchical representation.

SUMMARY

One embodiment of the invention provides a system that analyzes a layout related to a circuit on a semiconductor chip using an instance-based representation of a set of geometrical features that comprise the layout. The system operates by receiving a representation of the layout, wherein the representation defines a plurality of nodes that include one or more geometrical features. Next, the system converts the representation into an instance-based representation by identifying multiple occurrences of identical node instances in the layout, wherein each node instance can be further processed without having to consider effects of external factors on the node instance. The system then performs further processing on the instance-based representation by processing each node instance only once, whereby the processing does not have to be repeated on multiple occurrences of the node instance in the layout.

In one embodiment of the invention, the layout includes features on the semiconductor chip, or features on a mask that is used to create the semiconductor chip.

In one embodiment of the invention, converting the representation into the instance-based representation involves considering how interactions with other nodes affect each node, and considering how environmental attributes specified in the layout affect each node.

In one embodiment of the invention, the layout includes a hierarchy of nodes, wherein a given node in the hierarchy specifies a geometrical feature that is comprised of lower-level geometrical features that are represented by lower-level nodes that appear under the given node in the hierarchy.

In one embodiment of the invention, the system additionally collapses the hierarchy, so that each node in the hierarchy is represented by a node instance that is not affected by higher-level or neighboring nodes (sibling nodes) in the hierarchy.

In one embodiment of the invention, performing the further processing involves performing a die-to-database inspection. This is accomplished by performing an initial die-to-database inspection of an image generated from a node instance, and then performing die-to-die inspections between the image and other images generated from other occurrences of the node instance.

In one embodiment of the invention, performing the further processing involves performing verification on the layout to verify that a simulated silicon image of a node conforms to a layout of a node. In a variation on this embodiment, the simulated silicon image of the node is generated by applying optical proximity correction or phase shift masking to the node.

In one embodiment of the invention, performing the further processing involves performing proximity effect correction while generating a mask to be used in fabricating the circuit. In this way, a correction to be calculated once for a given node instance, and the calculated correction can be applied to other occurrences of the given node instance without having to recalculate the correction.

One embodiment of the invention provides a system that analyzes a layout related to a circuit on a semiconductor chip using an instance-based representation of a set of geometrical features that comprise the layout. The system operates by receiving a representation of the layout, wherein the representation defines a plurality of nodes that include one or more geometrical features. The system then converts the representation into an instance-based representation by identifying multiple occurrences of identical node instances in the layout, wherein each node instance can be further processed without having to consider effects of external factors on the node instance. Next, the system performs a defect analysis by locating defects, and then using the instance-based representation to correlate defects with a specific node instance in order to determine if the specific node instance is prone to defects.

DETAILED DESCRIPTION

Overview

An instance-based (IB) representation is a hierarchical design representation that is designed to allow parallel processing of a design hierarchy. In some embodiments, this is accomplished by restructuring the (or alternatively creating a new) hierarchical layout into a format in which the hierarchy information is separated from the geometrical shapes (and other information). Further, in the IB representation, the geometrical shapes and information may be stored as instances. Each instance in the IB representation (sometimes referred to as a physical cell) includes geometry information from the original cell (sometimes referred to as the actual cell) together with associated environment (e.g. structures within a halo, certain proximity, or interaction range of the cell).

Once a hierarchical design is processed into an IB representation it is possible to perform tasks in parallel on the instance cells. That is because each instance cell includes the necessary information about the relevant neighboring (in a physical/geometrical sense) structures in the layout. Further, if care is taken while instances are created to identify locations where a particular cell has similar interactions with neighboring layout geometries and structures, the number of instances created can be reduced. For example, if there is an instance in the IB representation where a cell C is interacting with a geometry from cell B as well as a geometry from cell A in a particular fashion, other locations where C has the same type of proximity interaction with the same geometries can be represented as a single instance.

The term instance thus has two meanings, the applicable one should be apparent from use. To repeat, in the context of a standard hierarchical layout, or non-IB representation, an instance is a particular cell (e.g. its geometry, contained cells, and/or other information, e.g. connectivity information, netlist information and/or information on coloring schemes.) Thus if a standard hierarchical layout includes five instances of a cell C, then the cell C appears five times (at various rotations, orientations, positions, etc.) within the layout. In contrast, in an IB representation, an instance refers to a specific environment for a given cell. For example, when a given IB representation has two instances of a cell, e.g. the instance cell $C_P$, that means there are two locations where a cell C has identical interactions with nearby geometries.

Returning to the layout shown in FIGS. 1A–1C, consider the instance of cell C (shown visually in FIG. 1B). Note that only the geometry of the single shape within C is available within the cell in the standard hierarchical layout. Contrast the standard cell with the IB representation shown in FIG. 1D as instance cell $C_P$. Here, the interaction range of the cell $C_P$ is shown as a dotted line. Note that the portions of nearby geometries within T that interact with the geometries within cell C are included inside the boundary of the instance cell. More particularly, a portion of the geometry in T, a portion of cell B and a portion of geometry from within cell A are included within instance cell $C_P$.

Figure 1D:
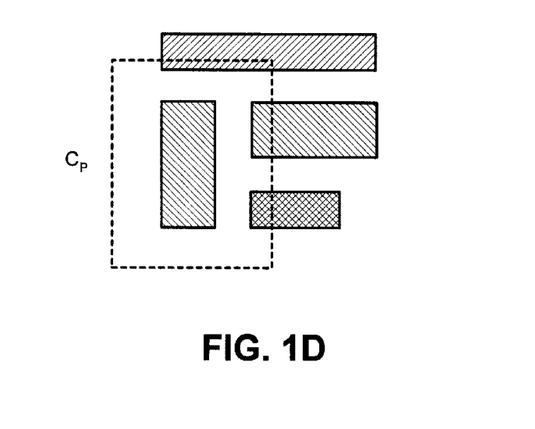
FIG. 1D illustrates an instance cell from an instance-based representation of the layout of FIG. 1A.

The instance cells can either directly store the geometrical information about the interacting geometries (e.g. the small rectangles for the portions of the three structures within the dotted lines) or can store references to the relevant geometric shapes themselves together with information about the relevant portions of those shapes that interact with cell C in this particular instance, $C_P$. The latter approach is used by some embodiments of the invention to reduce memory requirements (pointers/references generally require less storage space than additional geometrical shape information).

Further details about the IB representation are discussed below in conjunction with a discussion of other embodiments of the invention.

Design Hierarchy

Figure 2A:
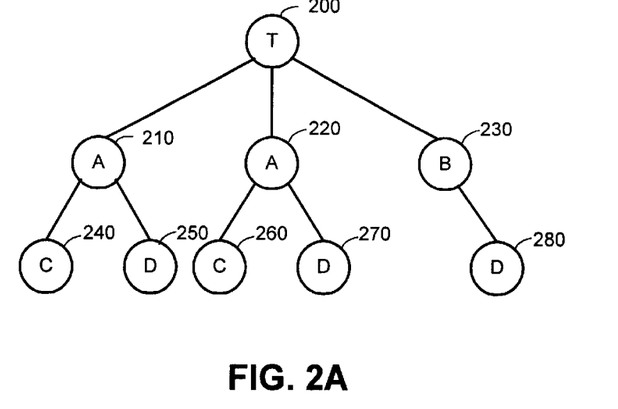
FIG. 2A illustrates a design hierarchy for a layout.
Figure 4:
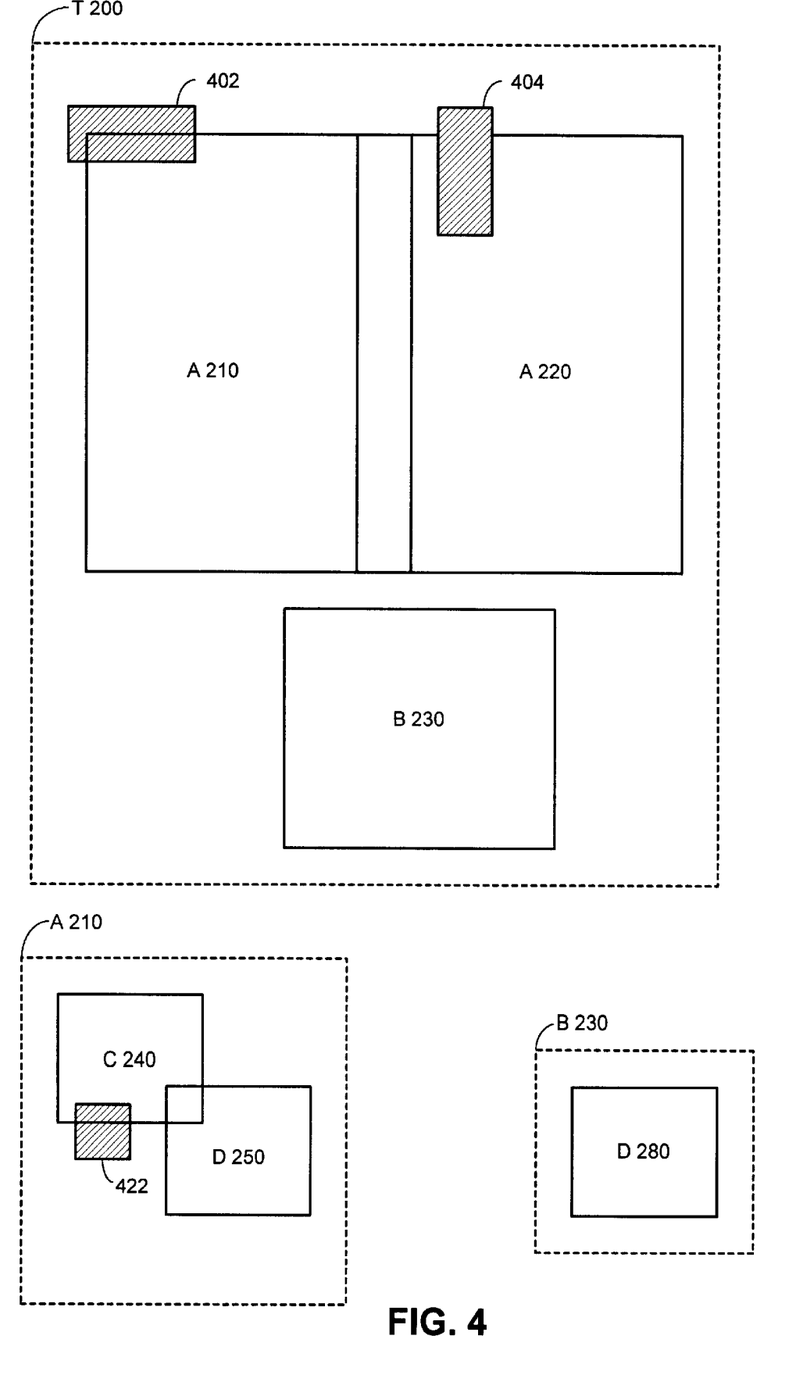
FIG. 4 presents an example of a hierarchical layout in accordance with an embodiment of the invention.

FIG. 2A illustrates an exemplary design hierarchy for a layout T 200, a visual depiction of the layout T 200 is shown in FIG. 4, see below. Layout T 200 includes two instances of the cell A, 210 and 220, as well as an instance of cell B 230. The first instance of the cell A 210 includes an instance of the cell C 240 and an instance of the cell D 250. Similarly, the second instance of the cell A includes an instance of the cell C 260 and an instance of the cell D 270. Cell B 230 includes an instance of the cell D 280.

Figure 2B:
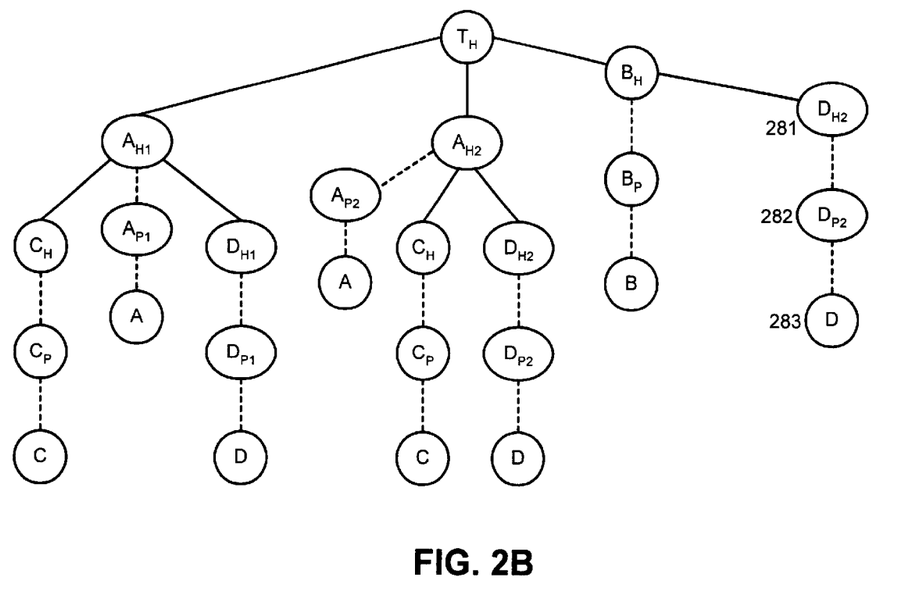
FIG. 2B illustrates a modified design hierarchy for the layout in accordance with an embodiment of the invention.

FIG. 2B illustrates a modified design hierarchy for the same layout T 200 in accordance with an embodiment of the invention. It is convenient to use this modified representation in generating the instance-based representation of the layout because the modified representation allows each node to encapsulate environmental information from its parent node as well as neighboring nodes.

This modified hierarchy can be generated by replacing each node in the original hierarchical representation (as illustrated in FIG. 2A) with three nodes. These three nodes includes a holding cell, a physical cell and an actual cell. The holding cell acts as a placeholder for the original cell. The physical cell contains information on environmental factors from a parent node or neighboring nodes that affect the node. For example, these environmental factors can include, geometries, connectivity information, netlist information and/or information on coloring schemes. Note that the term "coloring" refers to the process of marking phase shifting regions of a mask with different "colors" to differentiate different phase regions that are used to produce features through destructive light interference. A "coloring conflict" occurs when two differently colored regions become too close to each other, thereby causing unintentional destructive interference.

The physical cell also specifies areas of interest, e.g. the shapes and geometries upon which the relevant operations are to be performed. An interaction range for a cell covers an area surrounding the cell that must be examined for features that can interact with features defined within the cell. For example, for optical proximity correction (OPC) and phase shifting mask (PSM) production an interaction range (or halo) around the cell of approximately 1–2 $\mu$m is used. Note that as the wavelength of light ($\lambda$) being used decreases, the size of of the halo/interaction range can decrease. Thus, the halo may decrease below 1 $\mu$m. More specifically, in one embodiment when rules based OPC is performed the interaction range used is 1 $\mu$m while for model based OPC the interaction range used is 2 $\mu$m. Double halo for model-based OPC versus rule-based OPC is due to the fact that model-based OPC is an iterative process. Therefore the environment of a given feature is changing when neighboring features are corrected. In the case of rule-based OPC, the rules are designed to account for the change.

Finally, the actual cell can include the original cell. For example in FIG. 2A, cell D 280 is replaced by a holding cell $D_{H2}$ 281, a physical cell $D_{P2}$ 282, and an actual cell D 283.

As noted, it is generally the case that in an IB representation, the hierarchy information is separated from other information (thus the holding or hierarchy cells). A consequence of this arrangement is that in the hierarchy an instance cell (or physical cell) will not point to other physical cells. However, in some cases it may be convenient to merge a holding and physical cell into a single cell to reduce the number of nodes in the tree. This can be done where the hierarchy contains only a single cell, e.g. $D_{H2}$ 281 and $D_{P2}$ 282 in FIG. 2B.

Figure 3:
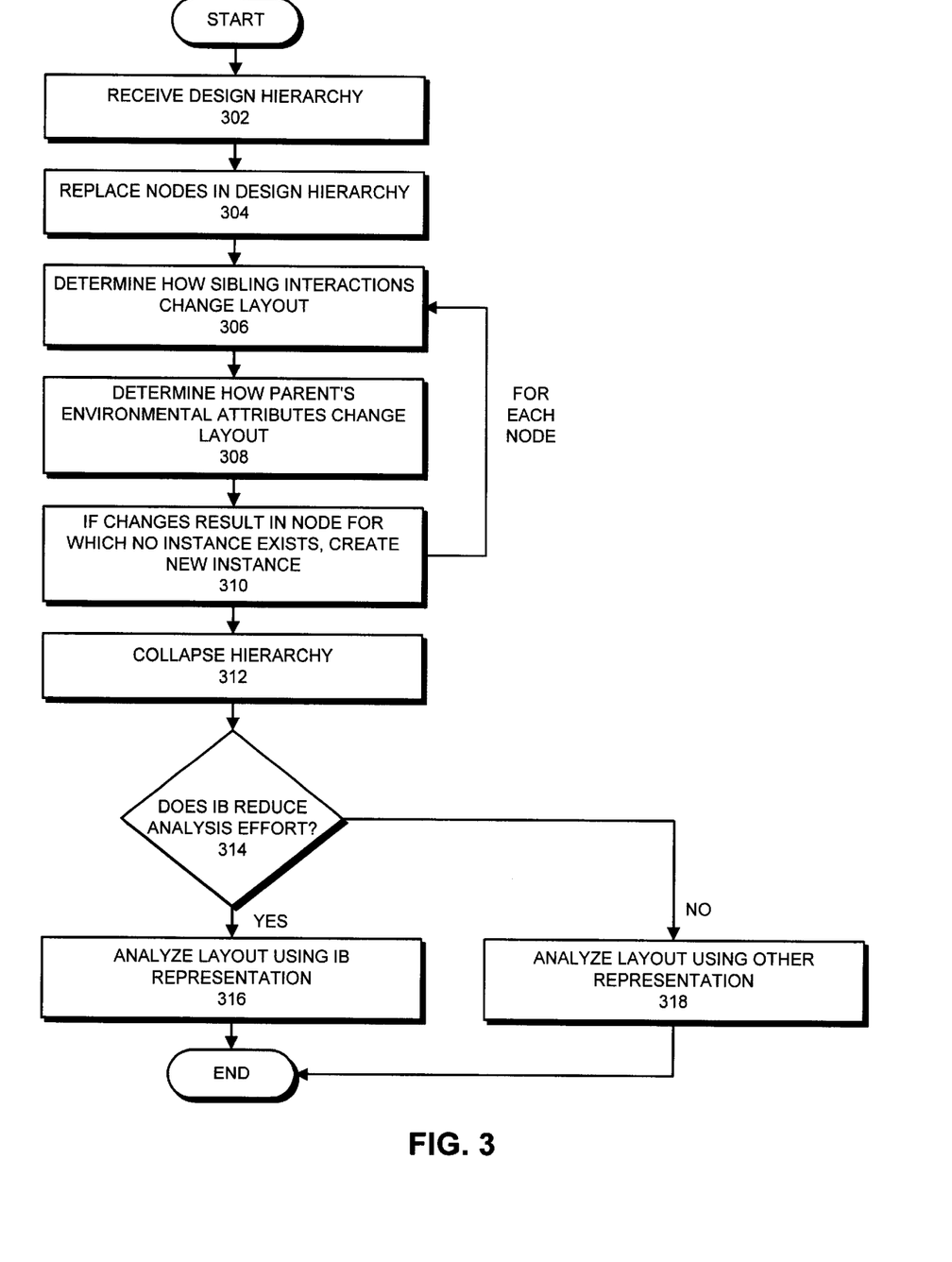
FIG. 3 is a flow chart illustrating the process of generating an instance-based representation from a hierarchical representation in accordance with an embodiment of the invention.

FIG. 3 is a flow chart illustrating the process of generating an instance-based representation from a hierarchical representation in accordance with an embodiment of the invention. The process starts by receiving a design hierarchy specifying the layout of the circuit (step 302). The system then replaces nodes in the design hierarchy as is illustrated in FIG. 2 (step 304).

Next, for each node in the design hierarchy, the system determines how interactions with siblings change the layout of the node (step 306). For example, a geometrical feature within a sibling node may cause a coloring conflict or a design rule violation that has to be remedied by modifying the layout of the node. The system also determines how the parent's environmental attributes change the layout (step 308). For example, in FIG. 4 a geometrical feature 402 defined within parent node 200 may cause a coloring conflict or design rule violation that must be remedied by changing the layout of the node. Finally, if any of these changes result in a new instance for which no instance has been created, the system creates a new instance (step 310).

In one embodiment of the invention, during the above-described process, the nodes are visited in topological order. This ensures that all instances of a parent node are created before a child node is analyzed.

In one embodiment of the invention, all instances of a master cell are generated before going on to the next cell.

Next, the design hierarchy is collapsed to merge holding cells that contain only a single physical cell into a single physical cell(step 312). This is not shown, however the IB representation would be similar to FIG. 2B with the appropriate holding and physical cells merged.

Note that an IB representation will not necessarily reduce the amount of layout that must be considered during subsequent analysis operations—however, the IB representation enables parallel processing of layouts. For example, if instances are not repeated in a layout, using an IB representation does not reduce the total layout area that must be analyzed. Therefore, it may be more efficient to use other representations in some situations.

In order to deal with these situations, the system additionally determines whether the IB representation will reduce analysis effort below a threshold value (step 314). If so, the system performs an analysis on the layout using the IB representation (step 316). Otherwise, the system performs the analysis on the layout using another representation, e.g. a flat, non-hierarchical, representation (step 318). Note that this analysis can involve any type of computational operation on the layout, including processing the layout for: optical proximity correction (OPC), design rule checking (DRC) and generation of phase shifting masks (PSM).

If two cells overlap so that a given (x,y) point falls inside the intersection of geometries of two different cells, that point may be represented in multiple different ways. In one embodiment, sometimes used for phase shifting masks, the (x,y) point will be a part of both physical cells, e.g. as part of the area of interest. In another embodiment, a given point (x,y) will be considered as part of the area of interest in only one of the cells. Visually, this can be understood as removing the intersection from the area of interest (e.g. the geometries of the actual cell) within one of the physical (instance) cells containing the intersection.

Example Hierarchical Layout

FIG. 4 presents an example of a hierarchical layout in accordance with an embodiment of the invention. This layout is a graphical representation of the layout illustrated in FIG. 2A. Within FIG. 4, a layout T 200 includes two instances of the cell A, 210 and 220, as well as an instance of the cell B 230. The first instance of the cell A 210 includes an instance of the cell C 240 and an instance of the cell D 250. The second instance of cell A 220 includes an instance of the cell C 260 (not shown in FIG. 4) and an instance of the cell D 270 (not shown in FIG. 4). Cell B 230 also includes an instance of the cell D 280.

In this graphical representation, layout T 200 includes two geometrical features 402 and 404 in addition to cells A 210, A 220 and B 230. Note that geometrical feature 402 affects the layout of cell A 210, and that geometrical feature 404 affects the layout of cell A 220. Also note that cell A 210 may affect the layout of neighboring cell A 220. Similarly, cell A 220 may affect the layout of neighboring cell A 210.

Consequently the system creates two instances of cell A. The first instance A 210 includes the effects of geometrical feature 402 and neighboring cell A 220. The second instance A 220 includes the effects of geometrical feature 404 and neighboring cell A 210.

The definition of cell A 210, which appears at the bottom of FIG. 4, includes cells C 240 and D 250 in addition to geometrical feature 422. Note that geometrical feature 422 affects the layout of cell C 240. Furthermore, cell C 240 can affect the layout of neighboring cell D 250, and cell D 250 can affect the layout of neighboring cell C 240. This causes the system to create an instance of the cell C 240 that includes the effects of geometrical feature 422 and neighboring cell D 250. This is the only instance created for cell C 240 because the other instance of cell C 260 under cell A 220 is the same as the instance of cell C 240 under cell A 210. The system also creates an instance of the cell D 250 that includes the effects of neighboring cell C 240.

Note that the definition of cell B 230 includes an instance of cell D 280, and this instance of cell D 280 is not affected by neighboring nodes or geometrical features defined within cell B 230. Hence, the system creates a second instance of cell D 280 that includes no effects from neighboring cells or geometrical features.

Moreover, note that it may be possible for factors that affect cell A to also affect cells C and D. For example, if geometrical feature 402 were to overlap cell C 240 (not shown), another instance of cell C 240, which includes the effects of geometrical feature 402, may have to be created. Hence, it is important to create all instances of parent cell A before creating instances of a child cells C and D because the different instances of the parent cell A may create additional instances of the child cells C and D.

Note that by using an instance-based representation, a computational task can be easily partitioned so that different instances are processed by different threads. This facilitates parallel processing and/or pipelined execution for computational tasks, such as optical proximity correction and design rule checking.

Using an Instance-Based Representation

Figure 5:
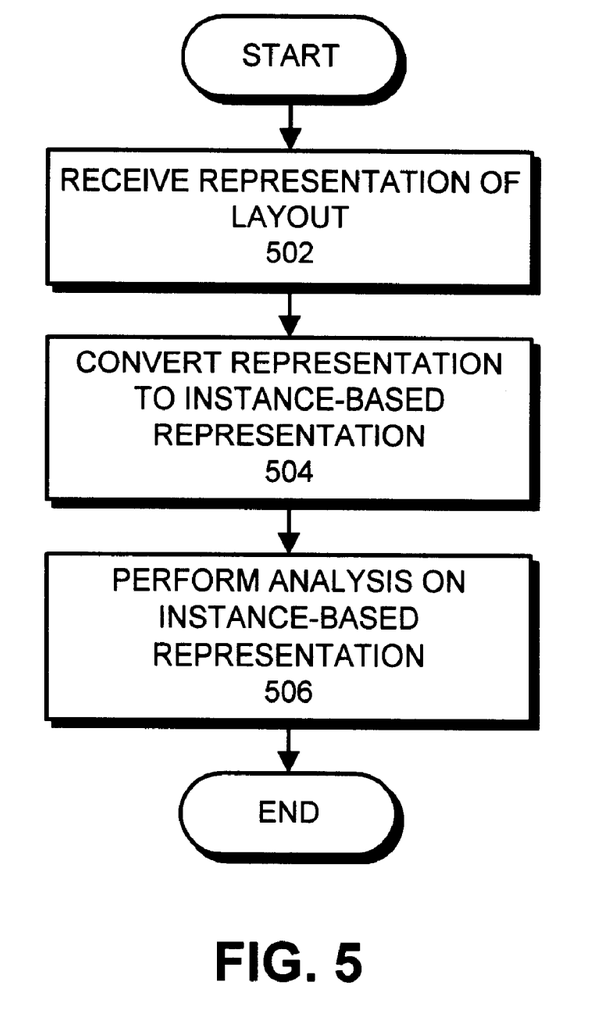
FIG. 5 is a flow chart illustrating the process of using an instance-based representation to analyze a layout in accordance with an embodiment of the invention.

FIG. 5 is a flow chart illustrating the process of using an instance-based representation to analyze a layout in accordance with an embodiment of the invention. The system starts by receiving a representation of a layout, which is possibly in hierarchical form (step 502). Next, the system converts the representation into an instance-based representation using the operations described above with reference to steps 304–312 in FIG. 3 (step 504). Finally, the system performs some type of analysis on the instance-based representation (step 506). This analysis can include various operations related to fabrication of a semiconductor chip, such as die-to-database inspection of a mask, defect analysis on a wafer or mask, verification of a layout against a simulated silicon image of the layout, and proximity effect correction during mask writing.

Note that although the invention is described in terms of a hierarchical representation of a layout, the invention is not limited to a hierarchical representation. Other non-hierarchical representations can be employed so long as they can be converted into instance-based form.

Furthermore, note that in some situations it may be advantageous to partially flatten smaller cells (nodes) into larger cells to eliminate inefficiencies in analyzing a large number of smaller cells. Also note that the instance-based interaction range can be tailored to target specific processing limitations and problems.

Die-to-Database Comparison

Figure 6A:
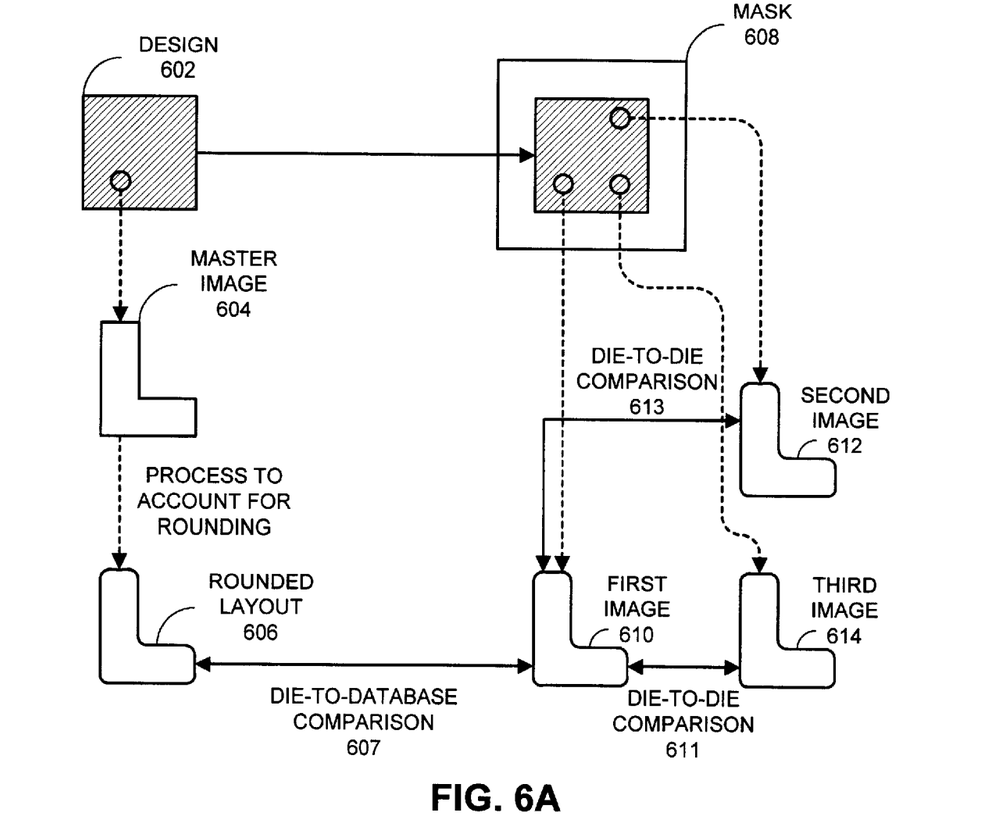
FIG. 6A illustrates a die-to-database comparison for a mask layout in accordance with an embodiment of the invention.

FIG. 6A illustrates a die-to-database comparison for a mask layout in accordance with an embodiment of the invention. This is an example of one type of analysis that could be performed at step 506, and more specifically performed on an instance-based representation of the layout. The system starts with a design 602, which is used to create a mask 608. Design 602 includes a master image (ideal layout) 604 of a cell instance. This master image 604 is processed using a set of computer-based rules to simulate rounding of corners in order to produce rounded layout 606.

Figure 6B:
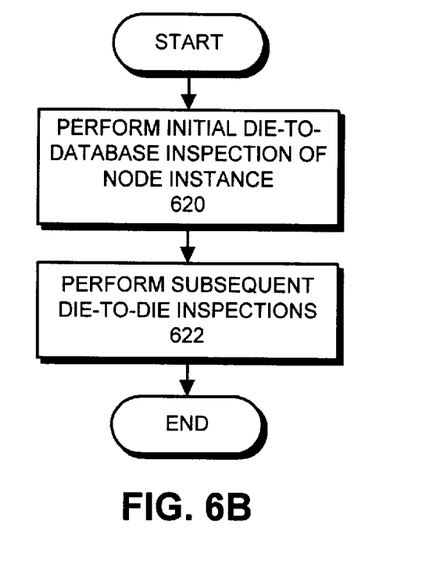
FIG. 6B is a flow chart illustrating the process or performing a die-to-database comparison for a mask layout in accordance with an embodiment of the invention.

Next, the system compares rounded layout 606 with a first image 610 of the mask taken by an inspection tool at the location of the corresponding cell in mask 608. This is a die-to-database comparison 607 (step 620 in FIG. 6B). The system subsequently uses first image 610 to perform die-to-die comparisons with additional images of the cell (step 622 in FIG. 6B). This includes a die-to-die comparison 613 with second image 612, as well as a die-to-die comparison 611 with third image 614. Note that an alternative embodiment tests several images produced from an instance to chose the one with the fewest (or least severe) defects. This selected image is then used to perform the die-to-die comparisons.

Note that the subsequent die-to-die comparisons can have a higher sensitivity than the initial die-to-database comparison 607 because the manufactured geometry in the first image 610 is often quite different than master image 604, even after processing to account for rounding.

Note also, that using embodiments of the invention it is also possible to determine which die has the defects automatically. In contrast, normally that is not possible (automatically) since it is not known a priori what the actual layout should like. In contrast, using embodiments of the invention, a reference image of the database is always available so that during die-to-die inspection, it is possible to accurately say which cell the defect is in.

Defect Analysis

Figure 7A:
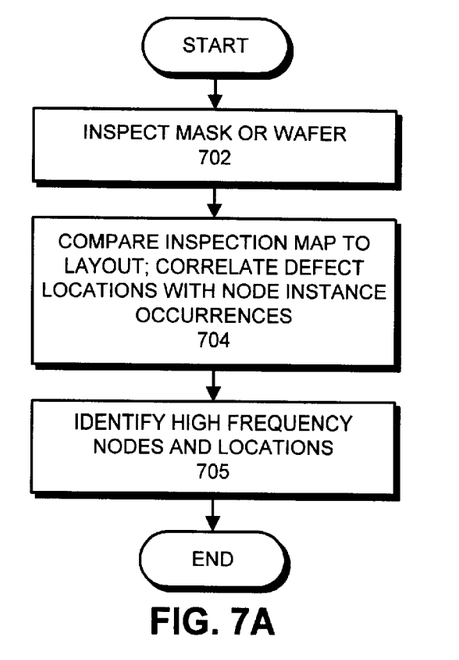
FIG. 7A is a flow chart illustrating the process of defect analysis using an instance-based representation in accordance with an embodiment of the invention.

FIG. 7A is a flow chart illustrating the process of defect analysis using an instance-based representation in accordance with an embodiment of the invention. This is another example of a type of analysis that could be performed at step 506. The system first inspects a mask or a wafer (step 702). This inspection produces an inspection map that identifies defects in the mask or the wafer. The system then compares the inspection map to an idealized layout of cells in the layout. This allows the system to correlate defect locations with specific node instances (step 704). Next, the system identifies node instances, and locations within node instances, that have a high frequency of defects (step 705). The resulting information can be used to identify features within nodes that are likely to cause defects. This allows the features to be modified or otherwise corrected to make such defects less likely. For example, if a layout contained a number of densely packed features which were treated with optical proximity correction features to prevent line end shortening, the analysis might determine that the added OPC features were causing bridging. Thus, the analysis of step 705 would lead to the conclusion that the OPC design was overly aggressive—too difficult to print with satisfactory yield—and should be scaled back.

Figure 7B:
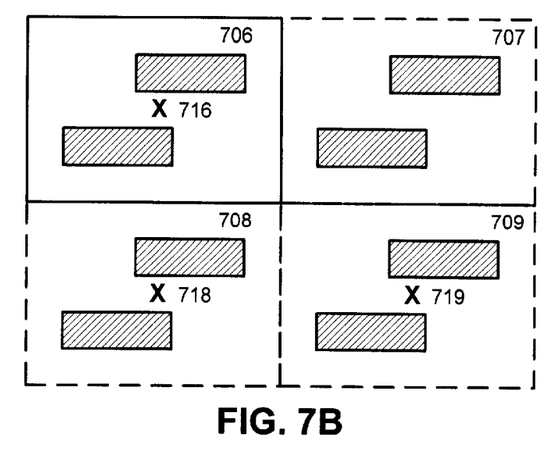
FIG. 7B illustrates an example of defect analysis using an instance-based representation in accordance with an embodiment of the invention.

FIG. 7B illustrates an example of defect analysis using an instance-based representation in accordance with an embodiment of the invention. In this example, there are four occurrences 706–709 of a specific node instance (for example a memory cell). Three of these occurrences, 706, 708 and 709, include corresponding defects, 716, 718 and 719 (represented by X's), which occur between the rectangular geometric features. By using the process described above with reference to FIG. 7A, the system is able to determine that the specific node instance is likely to have a defect between the rectangular geometric features.

Figure 7C:
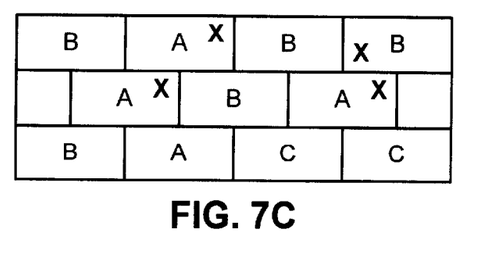
FIG. 7C illustrates another example of defect analysis using an instance-based representation in accordance with an embodiment of the invention.

FIG. 7C illustrates another example of defect analysis using an instance-based representation in accordance with an embodiment of the invention. In this example, the layout includes three types of cells A, B, and C. In this case, a number of defects (represented by X's) occur at a specific location in three occurrences of cell A. Another defect occurs in one occurrence of cell B. From this information, the system determines that a defect is likely to occur at the specific location in cell A. However, it may be overly presumptuous to conclude that cell B is likely to have a defect based upon the detection of the single defect. In some embodiments, the probability of having a defect at a certain location in a given cell is output. This information can then be used by a designer to reconsider the cell design and/or layout in light of the information. Here, for example, cell A has a defect rate of 75% in a given location. In one embodiment of the present invention, the designer is able to specify a minimum number of defects (or defect frequency) that must be detected in order for the system to conclude that a defect is likely to occur at a specific location.

Verification

Figure 8:
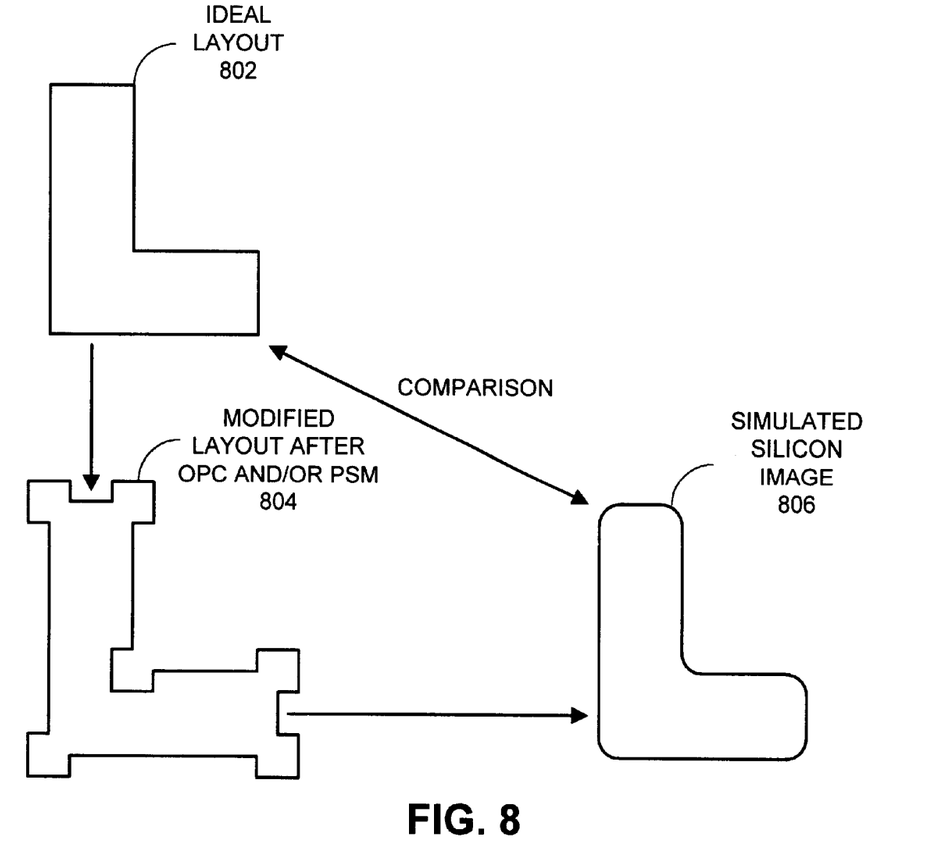
FIG. 8 illustrates the process of verifying a layout against a simulated silicon image of the layout in accordance with an embodiment of the invention.

FIG. 8 illustrates the process of verifying a layout 802 against a simulated silicon image 806 of the layout in accordance with an embodiment of the invention. The system starts with an ideal layout 802 of a cell. This ideal layout 802 is then processed through optical proximity correction (OPC) or phase shift masking (PSM) to produce a modified layout 804 (figure only shows OPC). The system then produces a simulated silicon image 806 from the modified layout 804. This simulated silicon image 806 is produced by simulating the effects of the optical lithography process on modified layout 804. This allows the system to compare simulated silicon image 806 against the ideal layout 802 of the cell.

Note a simulated silicon image 806 is only produced once for each different node instance. Hence, the simulation does not have to be repeated for additional occurrences of each node instance. These additional occurrences can simply use simulated silicon image 806, which has already been computed.

Proximity Effect Problem

Figure 9A:
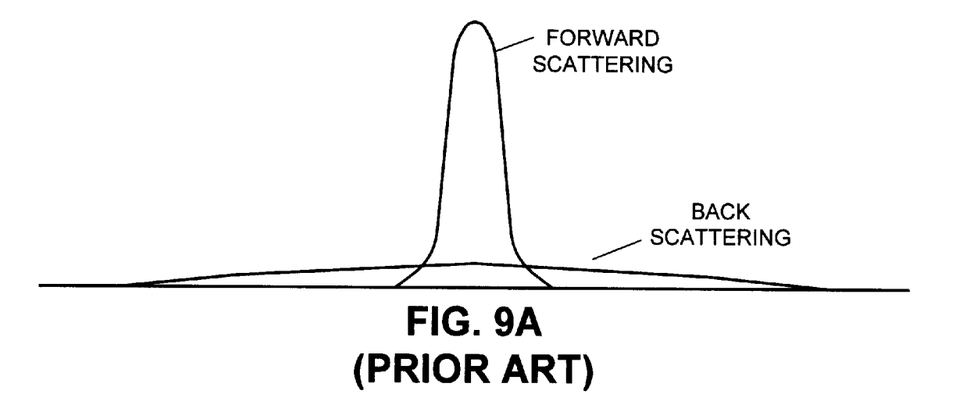
FIG. 9A illustrates the forward scattering effect and the back scattering effect during mask writing.
Figure 9B:
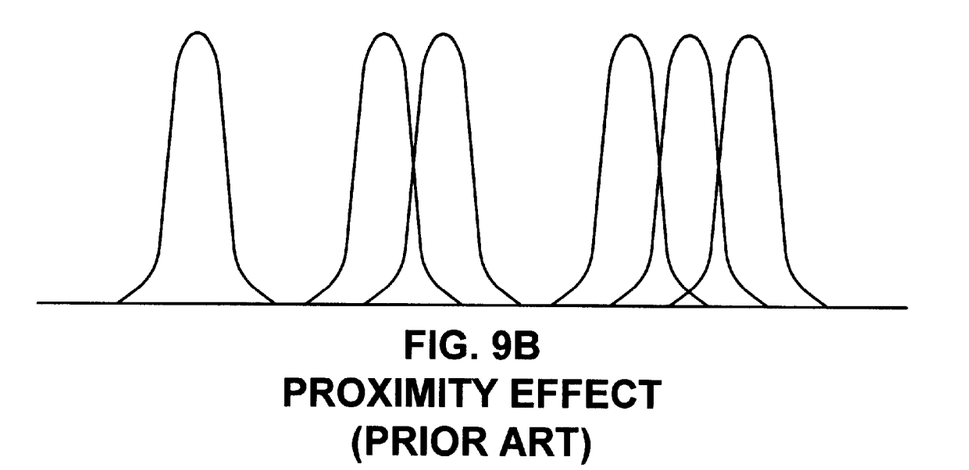
FIG. 9B illustrates the proximity effect problem during mask writing.

FIG. 9A illustrates the forward scattering effect and the back scattering effect during mask writing. Note that in using conventional electron beam (ebeam) tools or optical ultraviolet (UV) tools during the mask writing process there is a certain amount of forward scattering (represented by the sharp peak) and a certain amount of back scattering (represented by the wider peak). There is also a proximity effect caused by overlapping of the forward scattering and back scattering distributions as is illustrated in FIG. 9B.

This proximity effect causes narrower exposed regions to become narrower than wider regions given the same amount of exposure. In order to compensate for this effect, the system can either adjust the size of features in the layout, or alternatively, can adjust the dosage of the ebeam or UV tools.

Once the system calculates a compensation for a specific node instance, the compensation can be applied to other occurrences of the specific node instance without recalculating the compensation. However, note that this instance-based approach is better suited for vector scan mask writing tools than raster scan mask writing tools.

The preceding description is presented to enable any person skilled in the art to make. and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

Embodiments of the invention can be adapted for use with a variety of lithographic processes, including deep and extreme ultraviolet and X-ray lithographic processes.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for analyzing a layout related to a circuit on a semiconductor chip using an instance-based representation of a set of geometrical features that comprise the layout, comprising:

receiving a representation of the layout;

wherein the representation defines a plurality of nodes that include one or more geometrical features;

converting the representation into an instance-based representation by identifying multiple occurrences of identical node instances in the layout;

wherein each node instance can be further processed without having to consider effects of external factors on the node instance; and performing further processing on the instance-based representation by processing each node instance only once, whereby the further processing does not have to be repeated on multiple occurrences of the node instance in the layout.

2. The method of claim 1, wherein the layout can define at least one of:

features on the semiconductor chip; and a mask that is used to create features on the semiconductor chip.

3. The method of claim 1, wherein converting the representation into the instance-based representation involves:

considering how interactions with other nodes affect each node; and considering how environmental attributes specified in the layout affect each node.

4. The method of claim 1, wherein the layout includes a hierarchy of nodes; and wherein a given node in the hierarchy specifies a geometrical feature that is comprised of lower-level geometrical features that are represented by lower-level nodes that appear under the given node in the hierarchy.

5. The method of claim 4, further comprising collapsing the hierarchy, so that each node in the hierarchy is represented by a node instance that is not affected by higher-level or neighboring nodes in the hierarchy.

6. The method of claim 1, wherein performing the further processing involves performing a die-to-database inspection on the layout by:

performing an initial die-to-database inspection on an image generated from a node instance; and subsequently performing die-to-die inspections between the image and other images generated from other occurrences of the node instance.

7. The method of claim 1, wherein performing the further processing involves performing verification on the layout to verify that a simulated silicon image of a node conforms to a layout of a node.

8. The method of claim 7, wherein the simulated silicon image of the node is generated by applying optical proximity correction or phase shift masking to the node.

9. The method of claim 1, wherein performing the further processing involves performing proximity effect correction while generating a mask to be used in fabricating the circuit, whereby a correction can be calculated once for a given node instance, and the calculated correction can be applied to other occurrences of the given node instance without having to recalculate the correction.

10. A method for analyzing a layout related to a circuit on a semiconductor chip using an instance-based representation of a set of geometrical features that comprise the layout, comprising:

receiving a representation of the layout;

wherein the representation defines a plurality of nodes that include one or more geometrical features;

converting the representation into an instance-based representation by identifying multiple occurrences of identical node instances in the layout;

wherein each node instance can be further processed without having to consider effects of external factors on the node instance; and performing a defect analysis by, locating defects, and using the instance-based representation to correlate defects with a specific node instance in order to determine if the specific node instance is prone to defects.

11. The method of claim 10, wherein converting the representation into the instance-based representation involves:

considering how interactions with other nodes affect each node; and considering how environmental attributes specified in the layout affect each node.

12. The method of claim 10, wherein the layout includes a hierarchy of nodes; and wherein a given node in the hierarchy specifies a geometrical feature that is comprised of lower-level geometrical features that are represented by lower-level nodes that appear under the given node in the hierarchy.

13. A computer-readable storage medium storing instructions that when executed by a computer cause the computer to perform a method for analyzing a layout related to a circuit on a semiconductor chip using an instance-based representation of a set of geometrical features that comprise the layout, the method comprising:

receiving a representation of the layout;

wherein the representation defines a plurality of nodes that include one or more geometrical features;

converting the representation into an instance-based representation by identifying multiple occurrences of identical node instances in the layout;

wherein each node instance can be further processed without having to consider effects of external factors on the node instance; and performing further processing on the instance-based representation by processing each node instance only once, whereby the processing does not have to be repeated on multiple occurrences of the node instance in the layout.

14. The computer-readable storage medium of claim 13, wherein the layout can define:

features on the semiconductor chip; or a mask that is used to create features on the semiconductor chip.

15. The computer-readable storage medium of claim 13, wherein converting the representation into the instance-based representation involves:

considering how interactions with other nodes affect each node; and considering how environmental attributes specified in the layout affect each node.

16. The computer-readable storage medium of claim 13, wherein the layout includes a hierarchy of nodes; and wherein a given node in the hierarchy specifies a geometrical feature that is comprised of lower-level geometrical features that are represented by lower-level nodes that appear under the given node in the hierarchy.

17. The computer-readable storage medium of claim 16, wherein the method further comprises collapsing the hierarchy, so that each node in the hierarchy is represented by a node instance that is not affected by higher-level or neighboring nodes in the hierarchy.

18. The computer-readable storage medium of claim 13, wherein performing the further processing involves performing a die-to-database inspection on the layout by:

performing an initial die-to-database inspection on an image generated from a node instance; and subsequently performing die-to-die inspections between the image and other images generated from other occurrences of the node instance.

19. The computer-readable storage medium of claim 13, wherein performing the further processing involves performing verification on the layout to verify that a simulated silicon image of a node conforms to a layout of a node.

20. The computer-readable storage medium of claim 19, wherein the simulated silicon image of the node is generated by applying optical proximity correction or phase shift masking to the node.

21. The computer-readable storage medium of claim 13, wherein performing the further processing involves performing proximity effect correction while generating a mask to be used in fabricating the circuit, whereby a correction can be calculated once for a given node instance, and the calculated correction can be applied to other occurrences of the given node instance without having to recalculate the correction.

22. A computer-readable storage medium storing instructions that when executed by a computer cause the computer to perform a method for analyzing a layout related to a circuit on a semiconductor chip using an instance-based representation of a set of geometrical features that comprise the layout, the method comprising:

receiving a representation of the layout;

wherein the representation defines a plurality of nodes that include one or more geometrical features;

converting the representation into an instance-based representation by identifying multiple occurrences of identical node instances in the layout;

wherein each node instance can be further processed without having to consider effects of external factors on the node instance; and performing a defect analysis by,
locating defects, and
using the instance-based representation to correlate defects with a specific node instance in order to determine if the specific node instance is prone to defects.

23. The computer-readable storage medium of claim 22, wherein converting the representation into the instance-based representation involves:

considering how interactions with other nodes affect each node; and considering how environmental attributes specified in the layout affect each node.

24. The computer-readable storage medium of claim 22, wherein the layout includes a hierarchy of nodes; and wherein a given node in the hierarchy specifies a geometrical feature that is comprised of lower-level geometrical features that are represented by lower-level nodes that appear under the given node in the hierarchy.

25. An apparatus that analyzes a layout related to a circuit on a semiconductor chip using an instance-based representation of a set of geometrical features that comprise the layout, the apparatus comprising:

a receiving mechanism that is configured to receive a representation of the layout;

wherein the representation defines a plurality of nodes that include one or more geometrical features;

a conversion mechanism that is configured to convert the representation into an instance-based representation by identifying multiple occurrences of identical node instances in the layout;

wherein each node instance can be further processed without having to consider effects of external factors on the node instance; and an processing mechanism that is configured to perform further processing on the instance-based representation by analyzing each node instance only once, whereby the processing does not have to be repeated on multiple occurrences of the node instance in the layout.

26. The apparatus of claim 25, wherein the layout can define:

features on the semiconductor chip; or a mask that is used to create features on the semiconductor chip.

27. The apparatus of claim 25, wherein the conversion mechanism is configured to:

consider how interactions with other nodes affect each node; and to consider how environmental attributes specified in the layout affect each node.

28. The apparatus of claim 25, wherein the layout includes a hierarchy of nodes; and wherein a given node in the hierarchy specifies a geometrical feature that is comprised of lower-level geometrical features that are represented by lower-level nodes that appear under the given node in the hierarchy.

29. The apparatus of claim 28, further comprising a collapsing mechanism that is configured to collapse the hierarchy, so that each node in the hierarchy is represented by a node instance that is not affected by higher-level or neighboring nodes in the hierarchy.

30. The apparatus of claim 25, wherein the processing mechanism is configured to perform a die-to-database inspection on the layout by:

performing an initial die-to-database inspection on an image generated from a node instance; and subsequently performing die-to-die inspections between the image and other images generated from other occurrences of the node instance.

31. The apparatus of claim 25, wherein the processing mechanism is configured to perform verification on the layout to verify that a simulated silicon image of a node conforms to a layout of the node.

32. The apparatus of claim 31, wherein the simulated silicon image of the node is generated by applying optical proximity correction or phase shift masking to the node.

33. The apparatus of claim 25, wherein the processing mechanism is configured to perform proximity effect correction while generating a mask to be used in fabricating the circuit, whereby a correction can be calculated once for a given node instance, and the calculated correction can be applied to other occurrences of the given node instance without having to recalculate the correction.

34. An apparatus for analyzing a layout related to a circuit on a semiconductor chip using an instance-based representation of a set of geometrical features that comprise the layout, the apparatus comprising:

a receiving mechanism that is configured to receive a representation of the layout;

wherein the representation defines a plurality of nodes that include one or more geometrical features;

a conversion mechanism that is configured to convert the representation into an instance-based representation by identifying multiple occurrences of identical node instances in the layout;

wherein each node instance can be further processed without having to consider effects of external factors on the node instance; and a processing mechanism that is configured to, locate defects, and to
use the instance-based representation to correlate defects with a specific node instance in order to determine if the specific node instance is prone to defects.

35. The apparatus of claim 34, wherein the conversion mechanism is configured to:

consider how interactions with other nodes affect each node; and to consider how environmental attributes specified in the layout affect each node.

36. The apparatus of claim 34, wherein the layout includes a hierarchy of nodes; and wherein a given node in the hierarchy specifies a geometrical feature that is comprised of lower-level geometrical features that are represented by lower-level nodes that appear under the given node in the hierarchy.

37. A method for analyzing a layout related to a circuit on a semiconductor chip using an instance-based representation of a set of geometrical features that comprise the layout, comprising:

receiving a representation of the layout;

wherein the representation defines a plurality of nodes that include one or more geometrical features;

converting the representation into an instance-based representation by identifying multiple occurrences of identical node instances in the layout; and performing further processing on the instance-based representation, wherein performing the further processing on multiple occurrences of a node instance involves performing the further processing on the node instance only once, and then applying results of the further processing to other occurrences of the node instance.

38. A method for analyzing a layout related to a circuit on a semiconductor chip using an instance-based representation of a set of geometrical features that comprise the layout, comprising:

generating an instance-based representation of a layout by identifying multiple occurrences of identical node instances in the layout;

wherein the instance-based representation defines a plurality of nodes that include one or more geometrical features;

wherein each node instance can be further processed without having to consider effects of external factors on the node instance; and performing further processing on the instance-based representation by processing each node instance only once, whereby the processing does not have to be repeated on multiple occurrences of the node instance in the layout.

39. A system that analyzes a layout related to a circuit on a semiconductor chip using an instance-based representation of a set of geometrical features that comprise the layout, the system comprising:

a processor;

a memory;

a receiving mechanism that is configured to receive a representation of the layout;

wherein the representation defines a plurality of nodes that include one or more geometrical features;

a conversion mechanism that is configured to convert the representation into an instance-based representation by identifying multiple occurrences of identical node instances in the layout;

wherein each node instance can be further processed without having to consider effects of external factors on the node instance; and an processing mechanism that is configured to perform further processing using the processor on the instance-based representation by analyzing each node instance only once, whereby the processing does not have to be repeated on multiple occurrences of the node instance in the layout.

* * * * *